United States Patent [19]
Pike

[11] Patent Number: 4,465,981
[45] Date of Patent: Aug. 14, 1984

[54] ADAPTIVE CONTROL SIGNAL FILTER FOR AUDIO SIGNAL EXPANDER

[75] Inventor: Winthrop S. Pike, Princeton, N.J.

[73] Assignee: RCA Corporation, New York, N.Y.

[21] Appl. No.: 424,533

[22] Filed: Sep. 27, 1982

[51] Int. Cl.³ .......................... H03G 3/20; H03G 3/42
[52] U.S. Cl. .................................. 330/281; 330/136; 330/141
[58] Field of Search ............... 330/136, 141, 148, 151, 330/281, 263, 265, 301; 333/14; 455/244

[56] References Cited

U.S. PATENT DOCUMENTS

| | | | |
|---|---|---|---|
| 3,350,512 | 10/1967 | Percival et al. | 179/100.2 |
| 3,732,371 | 5/1973 | Burwen | 179/1 R |
| 3,980,964 | 9/1976 | Grodinsky | 330/29 |
| 4,220,929 | 9/1980 | Talbot et al. | 330/136 |
| 4,377,788 | 3/1983 | Christopher et al. | 330/136 |

OTHER PUBLICATIONS

"High Fidelity Volume Expander", N. C. Pickering, Audio Engineering, Sep. 1947.

"$70 Decoder for New CX Records", J. Roberts, Popular Electronics, Jan. 1982, pp. 39-44.

Primary Examiner—James B. Mullins
Assistant Examiner—Steven J. Mottola
Attorney, Agent, or Firm—E. M. Whitacre; P. J. Rasmussen; R. G. Coalter

[57] ABSTRACT

A resistance-capacitance filter smoothes the control voltage of an audio signal expander. An analog gate couples the greater, in a given sense, of the smoothed control voltage and a further voltage to the control terminal of a variable gain device in the audio signal path, the further voltage being equal to the filter input voltage less a constant equal to Vbe. A time constant modifier circuit reduces the filter time constant when the filter input voltage differs in either sense from the smoothed control voltage by a fraction, less than unity, of Vbe. The resultant, relatively "narrow" dead zones of the adaptive filter enable operation of the expander with relatively low signal voltage levels thereby enabling a corresponding reduction in supply voltage requirements and providing further advantages such as reduced power dissipation, reduced heat build-up and improved reliability.

11 Claims, 1 Drawing Figure

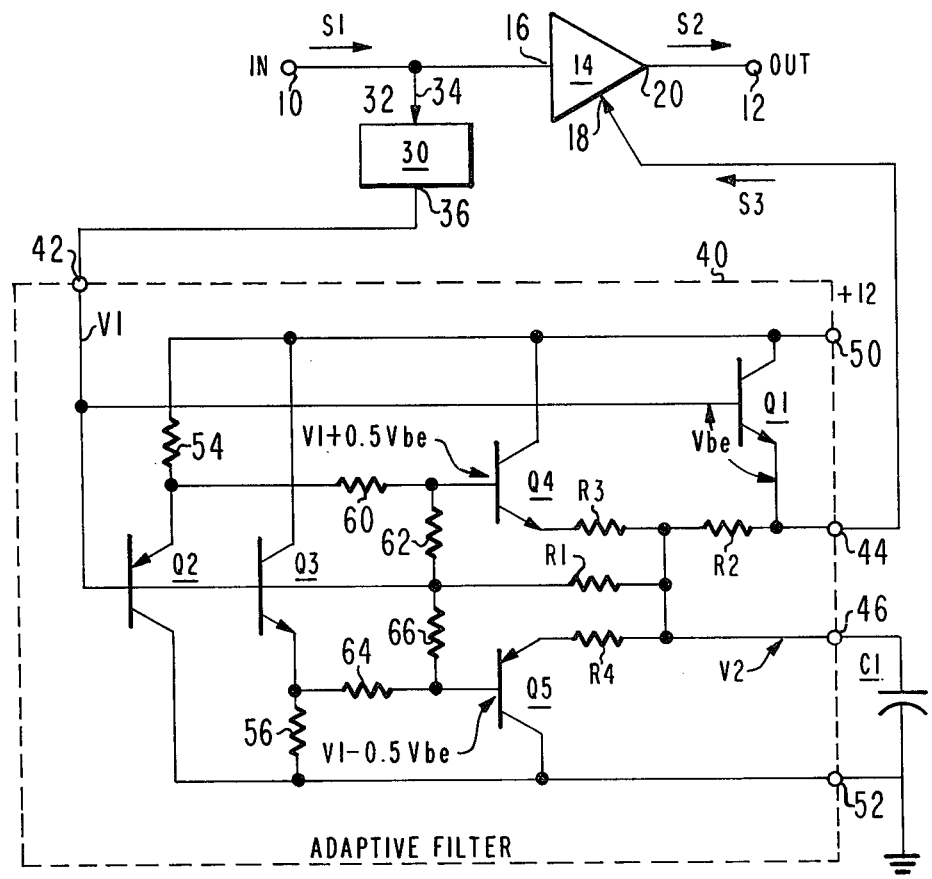

ADAPTIVE CONTROL SIGNAL FILTER FOR AUDIO SIGNAL EXPANDER

FIELD OF THE INVENTION

This invention relates to audio noise reduction systems and particularly to multi-time constant adaptive filters for use in the control signal path of an audio signal expander.

BACKGROUND OF THE INVENTION

It is known that one may preserve the dynamic range of an audio signal transmitted through a path or medium of relatively limited dynamic range by compressing the signal prior to transmission and then expanding the signal subsequent to transmission. This transmission technique is known as "companding" (a contraction of compression-expansion). Examples of syllabic audio signal companders are given in U.S. Pat. No. 3,732,371 which issued May 8, 1973, to R. S. Burwen and U.S. Pat. No. 4,220,429 which issued Sept. 2, 1980, to Talbot et al.

It is also known that one may improve the "apparent" dynamic range of audio signals by means of an expander even though the signals may be of uncompressed form. Examples of audio signal expanders for such "play-back only" applications are given in the article "High Fidelity Volume Expander" by N. C. Pickering in the September, 1947, issue of AUDIO ENGINEERING magazine and in U.S. Pat. No. 3,980,964 which issued Sept. 14, 1976, to R. M. Grodinsky.

A problem common to audio signal expanders (for either compressed or uncompressed signals) concerns avoidance of undesirable psycho-acoustical effects commonly referred to as "pumping" or "breathing". These effects occur in some systems when a change in signal level occurs which results in a change in the expander gain that is not masked or "covered up" by the program material. This problem is particularly troublesome when the amplitude of the audio input signal applied to the expander suddenly changes as occurs, for example, during a musical crescendo or decrescendo. In order to properly expand such transient signal with minimal audible "side effects", it is customary to employ control circuits in the expander which quickly respond to transient signal level changes but which respond more slowly for dynamically slowly changing signals. For this reason, expanders generally employ some form of adaptive or non-linear filtering to vary the expansion characteristic under differing dynamic conditions of the signal to be expanded.

As an example, in the arrangement proposed by Talbot et al., the input signal to be expanded is applied to a detector which produces a control voltage related to the input signal envelope. The control voltage is applied via a parallel combination of a diode and a first resistor to the control terminal of a gain control amplifier in the main audio signal path. The control terminal is also coupled to ground via a series connection of a second resistor and a capacitor.

In operation, for relatively small input signal level changes, the diode is not forward biased and the resistors and capacitor provide a relatively long time constant for smoothing the control signal. As a result, the rate of change of gain of the amplifier is limited to a value which minimizes audibility of gain changes. However, for large input signal transients, the diode becomes forward biased so that the control voltage is coupled essentially instantaneously to the amplifier gain control terminal thereby enabling immediate expansion of the input signal by the amplifier. The capacitor, which normally smooths the control voltage, is prevented from being excessively charged for brief transients because of the presence of the second resistor. Consequently, the gain of the amplifier quickly returns to its previous value subsequent to a brief transient signal condition.

Other examples of noise reduction systems in which a semiconductor diode is employed as a threshold device for modifying the time constant of an adaptive control signal filter are given, for example, in U.S. patent application Ser. No. 229,743 of Christopher et al., filed Jan. 29, 1981, and U.S patent application Ser. No. 258,432 filed Apr. 28, 1981, now U.S. Pat. No. 4,398,157, of C. B. Dieterich, a continuation in part of application Ser. No. 229,518 filed Jan. 29, 1981, now abandoned, the applications being assigned to the common assignee of the present invention. See also, the article by J. Roberts entitled "$70 Decoder for New CX Records" which was published in January, 1982, issue of the magazine POPULAR ELECTRONICS, pp. 39-44.

In the interest of cost reduction and improved reliability, it would be desirable to construct audio expanders, of the general kind discussed above, in integrated circuit form. It would be further desirable to operate the integrated circuit at a relatively low supply voltage level so as to obtain benefits such as reduced power consumption, reduced heat build-up and improved reliability.

Generally speaking, adaptive filter circuits which are designed to operate at a given supply voltage when using conventional silicon diodes as threshold conduction devices may be "scaled down", so to speak, to operate at a lesser supply voltage by substituting diodes having proportionally lower threshold voltages (e.g., germanium diodes, Shottky barrier silicon diodes, etc.) for the silicon diodes. Such a substitution, however, presents certain practical difficulties with regard to integrated circuit fabrication.

As an example, direct substitution of diodes of different materials or construction on the integrated circuit "chip" may require a further processing step (e.g., an added metalization or a deposition of a further semiconductor material). This may reduce the process yield. An alternative of connecting the "substitute" diode to the integrated circuit via external pin connections avoids the need for extra processing steps but requires additional circuit pins which may not be available in the desired integrated circuit package. Also, additional assembly costs may be involved in connecting the substitute diode to the extra pins and reliability may be degraded by the added connections. A further difficulty is that the "substitute" diode may have forward or reverse bias conduction characteristics which are greatly different from the desired "scaled down" values.

SUMMARY OF THE INVENTION

In view of the foregoing, it is an object of the invention to provide an adaptive filter for use in an audio signal expander and in which the absolute values of at least one attack and one decay threshold of the filter are less than Vbe, wherein Vbe is the base-emitter junction voltage of a transistor.

It is a further object of the invention to provide an adaptive filter featuring high stability with essentially no tendency towards oscillation and which may be constructed in integrated circuit form, if desired, without requiring special processing steps.

An adaptive filter for the expansion control voltage of an audio signal expander embodying the invention comprises an input terminal for receiving the expansion control voltage, V1, to be filtered, a first output terminal for providing a filtered expansion control signal and a second output terminal for connection to a filter capacitor. A first resistor is coupled between the input terminal and the second output terminal to form a low pass filter in combination with said filter capacitor, the low pass filter having a given time constant, the capacitor developing a voltage, V2, proportional to current supplied thereto via the first resistor. An analog gate means couples the greater, in a given sense, of the capacitor voltage V2 and a further voltage, V3, to the first output terminal, the further voltage being equal to the expansion control voltage V1 less a constant, Vbe, wherein Vbe is equal to the base-emitter junction threshold voltage of a bipolar transistor in the analog gate means. A first circuit means is coupled to the input terminal and to the second output terminal for modifying the time constant of the low pass filter when the expansion control voltage V1 and the capacitor voltage V2 differ in a first sense by an amount K1, wherein K1 is a voltage equal to a fraction of Vbe. A second circuit means is coupled to the input terminal and to the second output terminal for modifying the time constant of the low pass filter when the expansion control voltage V1 and the capacitor voltage V2 differ in an opposite sense by an amount K2, wherein K2 is a voltage equal to a fraction of Vbe.

BRIEF DESCRIPTION OF THE DRAWING

The sole FIGURE is a circuit diagram, partially in block form, of an audio signal expander embodying the invention.

DETAILED DESCRIPTION

The expander comprises an input terminal 10 for receiving an input signal S1 to be expanded and an output terminal 12 for providing an expanded output signal S2. Input terminal 10 is coupled to output terminal 12 via a variable gain device 14 having a first input terminal 16 coupled to terminal 10 for receiving the signal S1 to be expanded, a second input terminal 18 for receiving an expansion control signal S3 and an output terminal 20 coupled to supply the expanded output signal S3 to output terminal 12.

Variable gain device 14 may be of either the attenuating or the amplifying type, both being well known, and provides the function of controlling the level of the signal to be expanded in accordance with the value of the expansion control signal. Illustratively, an attenuating type of variable gain device may be constructed by coupling a resistor between terminals 16 and 20, coupling terminal 20 to a suitable source of reference potential (e.g., ground) via the conduction path of a field effect transistor and applying the control signal S3 to the transistor gate electrode. Such a relatively simple variable gain device may exhibit a relatively limited gain or level control range. In expander applications where a relatively wide signal expansion range is desired, it is preferable that device 14 be of the controllable gain amplifier type such as, illustratively, an operational transconductance amplifier or precision analog signal multiplier. Such devices are well known. See generally, the article "Linear ICs" by D. Ranada published in the Aug. 20, 1979, edition of the magazine EDN which provides a technical discussion of variable gain amplifiers.

The expansion control signal S3 is produced, initially, by a detector 30 and coupled to the control terminal 18 of variable gain device 14 via an adaptive filter 40. Detector 30 has an input terminal 32 coupled to terminal 10 via a conductor 34 and an output terminal 36 coupled to the input terminal 42 of adaptive control signal filter 40. Detector 30 provides the function of rectifying the input signal S1 to produce an output signal at terminal 36 which varies as a function of the envelope or amplitude of the input signal S1. For purposes of the present invention, the detector 30 may be of the average, peak or RMS responding type, all of which are well known.

For audio signal expansion applications it may be desirable that detector 30 include a high pass filter in its input circuit to reject low frequency noise components. A suitable cut off frequency would be on the order of 500 Hz or perhaps somewhat higher. In multiband expanders (e.g., expanders in which the signal is divided into several individual frequency bands) it is desirable that each detector include an input filter having a bandwidth corresponding to, or perhaps slightly less, than the frequency band of the variable gain device that it controls.

Adaptive filter 40 couples the expansion control voltage V1 produced by detector 30 to the gain control input of variable gain device 14 and modifies the dynamic characteristics of the control voltage in several ways so as to reduce the control voltage ripple content while allowing rapid response to dynamic changes in the signal level.

Filter 40 has a first output terminal 44 connected to supply the expansion control signal to variable gain device 14 and a second output terminal 46 coupled via a filter capacitor C1 to a point of reference potential (e.g., ground). Capacitor C1 is the only capacitor employed in the multi-time constant adaptive filter and is shown connected externally to the filter per se (outlined in phantom) because, as a practical matter, it is physically too large to be formed in an integrated circuit. Illustratively, capacitor C1 will be assumed to have a value of 20 micro-Farads.

Terminal 42 is coupled to terminal 46 via a first resistor R1 to thereby form, in combination with capacitor C1, a low pass filter having a relatively long time constant of about 2 seconds. For the assumed value of capacitor C1, a suitable value for resistor R1 giving this time constant is 100K-Ohms (K, here, is a decimal multiplier of X1000). This resistance value is not too large to include within the adaptive filter when constructed in integrated circuit form. Alternatively, resistor R1 may be connected externally between terminals 42 and 46 if desired and, as is apparent from the drawing, no additional integrated circuit pins are needed for external placement of this resistor.

Current flow through resistor R1 charges capacitor C1 to produce a filtered control voltage V2 at terminal 46. This voltage is coupled to output terminal 44 via resistor R2 for controlling the gain of device 14 under most operating conditions of the expander. Resistor R2, in combination with a common collector connected transistor Q1, forms an analog gate which effectively bypasses the low pass filter R1-C1 under certain conditions. Specifically, transistor Q1 is connected at the collector thereof to a supply voltage terminal 50 for receiving a positive supply voltage (e.g., +12 volts). The base and emitter electrodes of transistor Q1 are connected respectively to terminals 42 and 44.

When the audio input signal S1 experiences an abrupt increase in level such that voltage V1 exceeds the capacitor voltage V2 by Vbe (the base-emitter threshold voltage of transistor Q1), then transistor Q1 will turn on thereby coupling V1 (less Vbe) to terminal 44 thereby enabling essentially instantaneous expansion of the audio input signal S1 by variable gain device 14. During this transient condition, resistor R2 prevents significant charging of capacitor C1 by the voltage coupled to terminal 44 via transistor Q1 so that when the transient terminates the voltage at terminal 44 quickly returns to its previous value. A suitable value for resistor R2 is 10K-Ohms.

It is desirable that the input impedance at terminal 18 of device 14 be substantially greater than the value of resistor R2 to minimize control voltage errors due to current flow through resistor R2. If the impedance of terminal 18 is relatively low, a buffer amplifier (not shown) may be inserted in the path between terminals 18 and 44 in increase the impedance and thus minimize loading effects on the filter operation.

The remaining elements of filter 40 provide the function of modifying the filter time constant when the control signal voltage V1 differs from the capacitor C1 voltage V2 in either sense by an amount equal to a fraction of the base-emitter voltage Vbe of transistor Q1. As will be explained, the amount of modification (i.e., the magnitude of the change) of the time constant is a function of the sense of the difference in the V1 and V2 voltages.

The time constant modifier circuits comprise a pair of complementary emitter follower transistors Q2 and Q3, each connected at the base electrode thereof to input terminal 42. Transistor Q2 is connected at the collector electrode thereof to a supply terminal 52 (grounded) and at the emitter electrode thereof to supply terminal 50 via an emitter load resistor 54. Transistor Q3 is connected at the collector electrode thereof to terminal 50 and has an emitter electrode coupled to terminal 52 via an emitter resistor 56. Suitable values for resistors 54 and 56 are 4.7K-Ohms each.

Emitter follower transistors Q2 and Q3 each offset the control voltage V1 by substantially equal amounts (Vbe) but in opposite senses. The voltage at the emitter of transistor Q2 equals V1 plus Vbe and that at the emitter of transistor Q3 equals V1 minus Vbe. It will be recognized, of course, that Vbe does vary to a certain extent with changes in temperature and the junction current densities of transistors Q2 and Q3. However, for purposes of the present invention, the normal variance of Vbe with these parameters is small as compared with the signal voltages and may be ignored.

The base-emitter junction of PNP transistor Q2 is connected in parallel with a potential divider comprising series connected resistors 60 and 62 having an output tap at the common connection thereof coupled to the base of an NPN transistor Q4. The base-emitter junction of NPN transistor Q3 is similarly coupled to the base of a PNP transistor Q5 by means of a potential divider comprising resistors 64 and 66. The purpose of the potential dividers is to bias the base electrodes of transistors Q4 and Q5 at potentials more positive and less positive, respectively, than the voltage V1. A preferred value of offset voltage is one-half of the base-emitter voltage of transistor Q1, i.e., 0.5 Vbe. For this purpose, resistors 60–66 may have equal values, illustratively, 20K-Ohms.

Transistors Q4 and Q5 are coupled at the emitter electrodes thereof to terminal 46 via respective emitter resistors R3 and R4 and are connected at the collector electrodes thereof to terminals 50 and 52, respectively. Transistor Q4, thus biased, turns on whenever the control voltage V1 exceeds the capacitor voltage V2 in a positive sense by an amount equal to 0.5 Vbe. When turned on, transistor Q4 supplies additional charging current to capacitor C1 via resistor R3 thereby reducing the "attack" time constant of the adaptive filter as long as V1 is more positive than V2 plus Vbe. This action enables the audio signal expander to respond relatively rapidly to musical crescendos, for example, or similar increases in the level of audio input signal S1. The attack time constant is given, to a first approximation, by the values of resistor R3 and capacitor C1, a suitable value being about 30 milli-seconds. For the assumed value of capacitance (20 micro-Farads), a suitable value for resistor R3 is 1500 Ohms.

Transistor Q5, biased at 0.5 Vbe less positive than V1, turns on whenever V1 is 0.5 Vbe volts less positive than V2 thereby providing additional discharge current to capacitor C1 under such conditions. This reduces the filter "decay" time constant as long as V1 is less positive than V2 less Vbe and enables the audio signal expander to respond to relatively quick to musical decrescendos or similar reductions in the level of the audio signal S1. The decay time constant is given, to a first approximation (ignoring resistor R1), by the product of the values of capacitor C1 and resistor R4, a suitable value being about 200 milli-seconds. For the assumed value of capacitance, resistor R4 may have a value of about 10,000 Ohms.

A subtle feature of the invention is that all PNP transistors in the adaptive filter have collector electrodes connected to a supply terminal (52). This enables the PNP transistors to be constructed as vertical (rather than lateral) devices in an integrated circuit. Vertical PNP transistors, as is known, have substantially better current gain characteristics than lateral transistors and also require less space on the integrated circuit.

A further feature is that all five active devices of the filter are coupled in what may be termed a "feed forward" arrangement. Since no feedback paths are involved within the filter, the circuit is unconditionally stable and exhibits no tendency towards oscillation. This is particularly advantageous in an integrated circuit which may include other components of the audio signal expander containing active (amplifying) devices (e.g., detector 30 and variable gain device 14).

Various changes may be made to the expander of the present invention. For a multi-channel system, for example (e.g., stereophonic or quadraphonic), each channel may be provided with a separate detector and variable gain device. Only a single adaptive filter would be needed, however, by appropriately combining the detector outputs and applying the resultant combined outputs to the input of the adaptive filter. The output of the adapative filter would then be connected to control each variable gain device. The reference potential to which the lower plate of capacitor C1 is connected is a matter of design choice, but if other than ground level is used, it should be a substantially fixed voltage level so as not to introduce control signal variations unrelated to the signal being expanded. It will also be appreciated that resistors 60-64 may be selected to provide values of attenuation other than 0.5 if necessary or desirable to obtain different expansion characteristics in a given application.

What is claimed is:

1. An adaptive filter for filtering the expansion control signal of an audio signal expander, comprising:

an input terminal for receiving an expansion control voltage, V1, to be filtered, a first output terminal for providing a filtered expansion control signal and a second output terminal for connection to a filter capacitor;

a first resistor coupled between said input terminal and said second output terminal to form a low pass filter in combination with said filter capacitor, said low pass filter having a given time constant, said capacitor developing a voltage, V2, proportional to current supplied thereto via said first resistor;

analog gate means for coupling the greater, in a given sense, of said capacitor voltage V2 and a further voltage, V3, to said first output terminal, said further voltage being equal to said expansion control voltage V1 less a constant K, wherein K is equal to the base-emitter threshold voltage, Vbe, of a bipolar transistor in said analog gate means;

first circuit means coupled to said input terminal and to said second output terminal for modrfying the time constant of said low pass filter when said expansion control voltage V1 and said capacitor voltage V2 differ in a first sense by a voltage K1, wherein K1 is less than Vbe; and second circuit means coupled to said input terminal and to said second output terminal for modifying the time constant of said low pass filter when said expansion control voltage V1 and said capacitor voltage V2 differ in an opposite sense by a voltage K2, wherein K2 is less than Vbe.

2. An adaptive filter as recited in claim 1 wherein said amount K1 is substantially equal to said amount K2.

3. An adaptive filter as recited in claim 1 wherein said amount K1 and said amount K2 are each substantially equal to one-half Vbe.

4. An adaptive filter for filtering the expansion control signal of an audio signal expander, comprising:

an input terminal for receiving an expansion control voltage, V1, to be filtered, a first output terminal for providing a filtered expansion control signal and a second output terminal for connection to a filter capacitor;

a first resistor coupled between said input terminal and said second output terminal to form a low pass filter in combination with said filter capacitor, said low pass filter having a given time constant, said capacitor developing a voltage, V2, proportional to current supplied thereto via said first resistor;

analog gate means for coupling the greater, in a given sense, of said capacitor voltage V2 and a further voltage being equal to said expansion control voltage V1 less a constant K, wherein K is equal to the base-emitter threshold voltage, Vbe, of a bipolar transistor in said analog gate means;

first circuit means coupled to said input terminal and to said second output terminal for modifying the time constant of said low pass filter when said expansion control voltage V1 and said capacitor voltage V2 differ in a first sense by a voltage K1, wherein K1 is less than Vbe;

second circuit means coupled to said input terminal and to said second output terminal for modifying the time constant of said low pass filter when said expansion control voltage V1 and said capacitor voltage V2 differ in an opposite sense by a voltage K2, wherein K2 is less than Vbe; and wherein:

said first circuit means comprises an emitter follower transistor having a base electrode connected to said input terminal, potential divider means connected in parallel with the base-emitter junction of said emitter follower transistor and time constant modifying means coupled between an output tap of said potential divider means and said second output terminal.

5. An adaptive filter as recited in claim 4 wherein said time constant modifying means comprises a series connection of a diode means and a resistor.

6. An adaptive filter as recited in claim 5 wherein said time constant modifying means comprises the base-emitter junction of a common collector connected transistor and said resistor has a value selected to be less than that of said first resistor.

7. An adaptive filter for filtering the expansion control signal of an audio signal expander, comprising:

an input terminal for receiving an expansion control voltage, V1, to be filtered, a first output terminal for providing a filtered expansion control signal and a second output terminal for connection to a filter capacitor;

a first resistor connected between said input terminal and said second output terminal;

an emitter follower transistor of a given conductivity type having a base electrode connected to said input terminal;

a potential divider connected in parallel with the base-emitter junction of said emitter follower transistor and having an output tap;

a second transistor of complementary conductivity type and having a base electrode connected to said output tap and an emitter electrode connected via a second resistor to said second output terminal;

a third transistor having a base electrode connected to said input terminal, an emitter electrode coupled to said first output terminal; and a third resistor connected between said first and second output terminals.

8. In combination:

first and second supply nodes, an input node and first and second output nodes;

first, second, third, fourth and fifth transistors, each having emitter, base and collector electrodes;

first means coupling said input node to the base electrodes of said first, second and third transistors;

second means coupling the collector electrodes of said first, third and fourth transistors to said first supply node;

third means coupling the collector electrodes of said second and fifth transistors to said second supply node;

a first resistor connected between said first and second output nodes;

a second resistor connected between the emitter electrode of said fourth transistor and said second output node;

a third resistor connected between the emitter electrode of said fifth transistor and said second output node;

fourth means coupling the base electrode of said fourth transistor to the base and emitter electrodes of said second transistor; and fifth means coupling the base electrode of said fifth transistor to the base and emitter electrodes of said third transistor.

9. The combination recited in claim 8 further comprising capacitor means coupled between said second output terminal and a point of reference potential.

10. The combination recited in claim 9 further comprising an input terminal for receiving an audio input signal, an output terminal for providing an expanded audio output signal, variable gain means interposed in a path between said input and output terminals, detector means interposed in a path between said input terminal and said input node and means coupling said first output node to a gain control input of said variable gain means.

11. The combination recited in claim 8 wherein said fourth and fifth means each comprise a respective potential divider means having a division factor substantially equal to one-half.

* * * * *

UNITED STATES PATENT AND TRADEMARK OFFICE
CERTIFICATE OF CORRECTION

PATENT NO. : 4,465,981

DATED : August 14, 1984

INVENTOR(S) : Winthrop Seeley Pike

It is certified that error appears in the above-identified patent and that said Letters Patent is hereby corrected as shown below:

Column 2, line 16     after January 29, 1981 insert -- which issued March 22, 1983 as U. S. Patent No. 4,377,788 --

Signed and Sealed this

Twenty-sixth Day of February 1985

[SEAL]

Attest:

DONALD J. QUIGG

Attesting Officer     Acting Commissioner of Patents and Trademarks